United States Patent
Crotty et al.

(10) Patent No.: US 6,847,228 B1
(45) Date of Patent: Jan. 25, 2005

(54) CARRY LOGIC DESIGN HAVING SIMPLIFIED TIMING MODELING FOR A FIELD PROGRAMMABLE GATE ARRAY

(75) Inventors: Patrick J. Crotty, San Jose, CA (US); Tao Pi, Sunnyvale, CA (US); Steven P. Young, Boulder, CO (US)

(73) Assignee: Xilinx, Inc., San Jose, CA (US)

( * ) Notice: Subject to any disclaimer, the term of this patent is extended or adjusted under 35 U.S.C. 154(b) by 98 days.

(21) Appl. No.: 10/300,212

(22) Filed: Nov. 19, 2002

(51) Int. Cl.[7] .......................... H03K 19/173; G06F 7/50
(52) U.S. Cl. ............................ 326/38; 326/41; 708/700
(58) Field of Search ............................ 326/38, 41, 47, 326/52–55; 327/361; 708/700–703

(56) References Cited

U.S. PATENT DOCUMENTS

| | | | | |
|---|---|---|---|---|
| 5,416,367 A | * | 5/1995 | Chan et al. | 326/44 |
| 5,629,886 A | * | 5/1997 | New | 708/711 |
| 5,724,276 A | * | 3/1998 | Rose et al. | 708/235 |
| 5,744,995 A | * | 4/1998 | Young | 327/407 |

OTHER PUBLICATIONS

Xilinx, Inc., "Virtex –II 1.5 V Field Programmable Gate Arrays," Virtex–II Platform FPGA Handbook, Dec. 6, 2000, pp. 46–53, , available from Xilinx, Inc. located at 2100 Logic Drive, San Jose, CA 95124.

* cited by examiner

*Primary Examiner*—James H. Cho
(74) *Attorney, Agent, or Firm*—E. Eric Hoffman; Edel M. Young; Lois D. Cartier

(57) ABSTRACT

A configurable logic block (CLB) slice is provided that includes a single path for a carry input signal to propagate through the CLB slice as a carry output signal. This single path includes a multiplexer that is configured to receive the input signals (including the carry input signal) and provides an output signal that can be routed as the carry output signal. A driver circuit can be coupled to the output terminal of the multiplexer, thereby improving the drive of the single path. A separate path is provided in parallel with the first multiplexer path, thereby enabling the carry input signal to be applied to exclusive OR gates within the CLB slice, or to be provided as an intermediate carry output signal. The single path provides a relatively fast and consistent manner of routing the carry input signal through the CLB slice as the carry output signal. The first and second paths accommodate a carry initialization signal as well as an intermediate carry input signal.

22 Claims, 5 Drawing Sheets

CARRY LOGIC DESIGN HAVING SIMPLIFIED TIMING MODELING FOR A FIELD PROGRAMMABLE GATE ARRAY

FIELD OF THE INVENTION

The present invention relates to a carry logic structure for use in a field programmable gate array (FPGA).

DISCUSSION OF THE RELATED ART

FIG. 1 is a schematic diagram of a slice 100 of a conventional configurable logic block (CLB) in a conventional field programmable gate array (FPGA). CLB slice 100 includes function generators 101–102, exclusive OR gates 103–104, AND gates 105–106 and 128, multiplexers 111–120 and configuration memory cells 121–127. Multiplexers 111–117 and 120 are configured in response to configuration values stored in configuration memory cells 121–128, respectively.

CLB slice 100 implements a carry logic structure, which includes multiplexers 117–120. These multiplexers 117–120 provide for the propagation of carry logic signals. For example, CLB slice 100 receives a carry input signal CIN, which can be propagated as a carry output signal COUT in one of two ways. First, the carry input signal CIN can be routed through multiplexer 120 as the carry output signal COUT. This carry signal path, which is referred to as a look-ahead path, is relatively fast, as it only requires transmission through a single multiplexer. Second, the carry input signal CIN can be routed through multiplexers 117–120 as the carry output signal COUT. This carry signal path enables the carry input signal CIN to be routed in a flexible manner. For example, the carry input signal CIN can be routed to exclusive OR gate 103 and/or exclusive OR gate 104 via multiplexers 117 and 118 and to COUT through multiplexers 117, 118, 119, and 120 under control of multiplexers 113, 116, and memory cell 127 (which controls multiplexer 117 and AND gate 128). However, the carry signal path through multiplexers 117–120 is relatively slow, as this path requires transmission through four separate multiplexers. Thus, the carry signal propagation delay through multiplexers 117–120 may be on the order of about 200 picoseconds, while the carry signal propagation delay through multiplexer 120 may be on the order of about 50 picoseconds. CLB slice 100 is more fully described in "Virtex-II Platform FPGA Handbook" 2000, pages 46–53 by Xilinx Inc., 2100 Logic Drive, San Jose, Calif. 95124.

The different carry signal propagation delays result in difficulties in modeling the timing of the carry signal path. Thus, when designing a circuit using CLB slice 100, the associated design software must allow a minimum carry signal propagation delay equal to the delay of the slowest path. That is, the design software must allow for a carry signal propagation delay equal to the time required for the carry input signal CIN to propagate through multiplexers 117–120. As described above, this propagation delay can be as high as 200 picoseconds, even though the carry input signal CIN is capable of propagating through CLB slice 100 in 50 picoseconds through the look-ahead carry signal path.

It would therefore be desirable to have an FPGA carry logic circuit that provides for a fast and consistent carry signal propagation delay through multiple paths of a CLB slice.

SUMMARY

Accordingly, the present invention provides a CLB slice that includes a single path for the carry input signal to propagate through the CLB slice as the carry output signal. This single path includes a first multiplexer that is configured to receive the input signals that can be finally routed as the carry output signal. Thus, the first multiplexer is coupled to receive a carry input signal received from outside the CLB slice, as well as other selected signals within the CLB slice.

A separate path is provided in parallel with the first multiplexer, thereby enabling the carry input signal to be applied to exclusive OR gates within the CLB slice, or to be provided as an intermediate carry output signal.

In one embodiment, the first multiplexer is a single-level multiplexer that includes a plurality of transmission gates, each being coupled to receive a corresponding one of the input signals. The multiplexer further includes an output terminal that is commonly connected to each of the transmission gates. Thus, each of the input signals can be routed through the first multiplexer with the delay associated with a single transmission gate.

A decoder circuit controls the configuration of the first multiplexer. The decoder circuit is configured to receive a plurality of control signals from within the CLB slice. For example, the decoder circuit can be configured to receive the signals provided by the function generators in the CLB slice. In response, the decoder circuit generates a plurality of routing control signals, which are provided to control the configuration of the first multiplexer. The first multiplexer activates one of the transmission gates in response to the routing control signals. The decoder circuit can include one or more configuration memory cells that are used to control the generation of the routing control signals.

A driver circuit can be coupled to the output terminal of the first multiplexer, thereby improving the drive of the carry output signal. This driver circuit can include a single inverter, or a series-connected pair of inverters.

In one variation, a CLB structure includes a first plurality of function generators, a second plurality of function generators, and a carry input terminal for receiving a carry input signal. A first multiplexer is coupled to receive the carry input signal and one or more input signals to the first plurality of function generators. A second multiplexer is coupled to an output terminal of the first multiplexer, the second multiplexer further coupled to receive one or more input signals to the second plurality of function generators. In a particular embodiment, both the first and second multiplexers are single-level multiplexers. A carry output terminal for providing a carry output signal from the CLB structure is coupled to an output terminal of the second multiplexer. The carry input signal therefore has a single path through the CLB carry structure, which extends through the first and second multiplexers to the carry output terminal. Parallel paths are provided in the CLB structure to enable the carry input signal (and the signal routed by the first multiplexer) to be routed to exclusive OR gates, or be routed as intermediate carry output signals.

In a particular embodiment, a first decoder circuit configures the first multiplexer in response to signals provided by the first plurality of function generators, and a second decoder circuit configures the second multiplexer in response to signals provided by the second plurality of function generators.

The present invention will be more fully understood in light of the following detailed description taken together with the drawings.

DETAILED DESCRIPTION OF THE PREFERRED EMBODIMENTS

Figure 1:
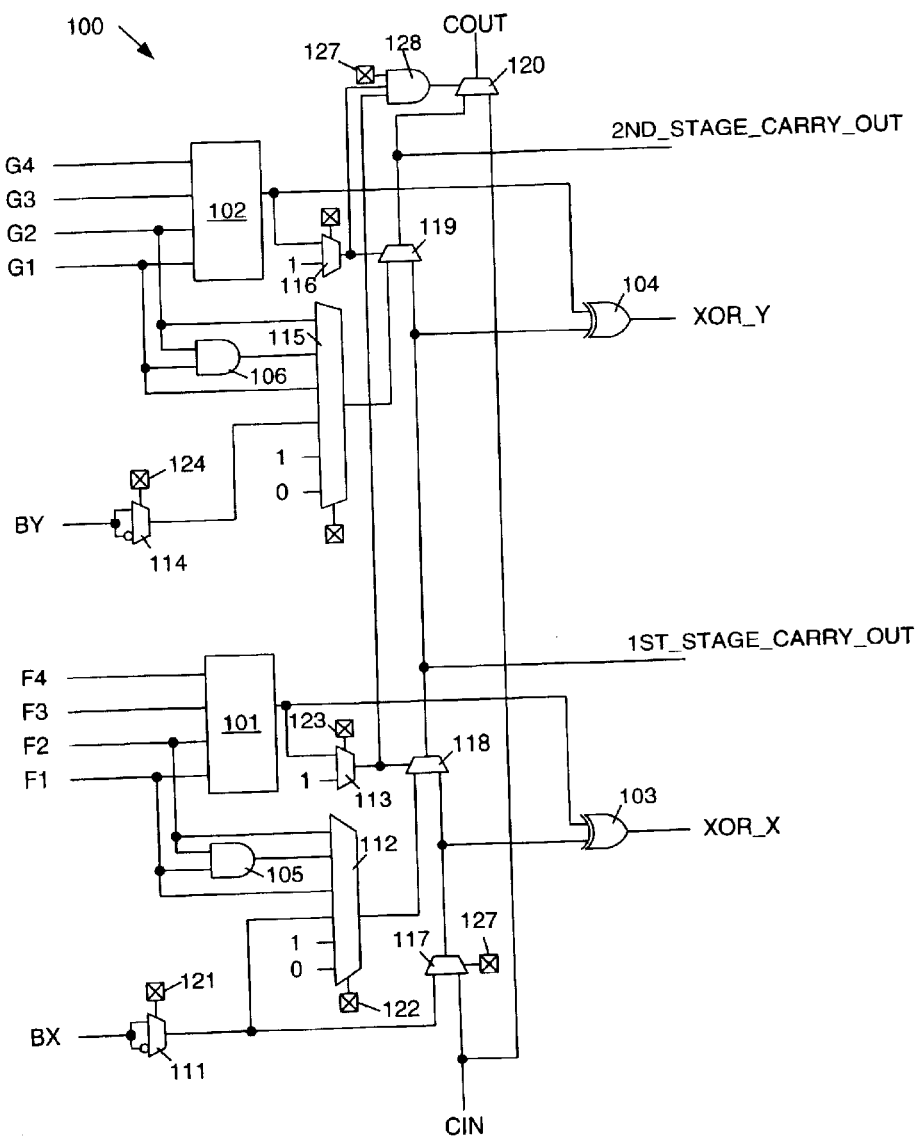
FIG. 1 is a schematic diagram of a prior art configuration logic block (CLB) slice.
Figure 2:
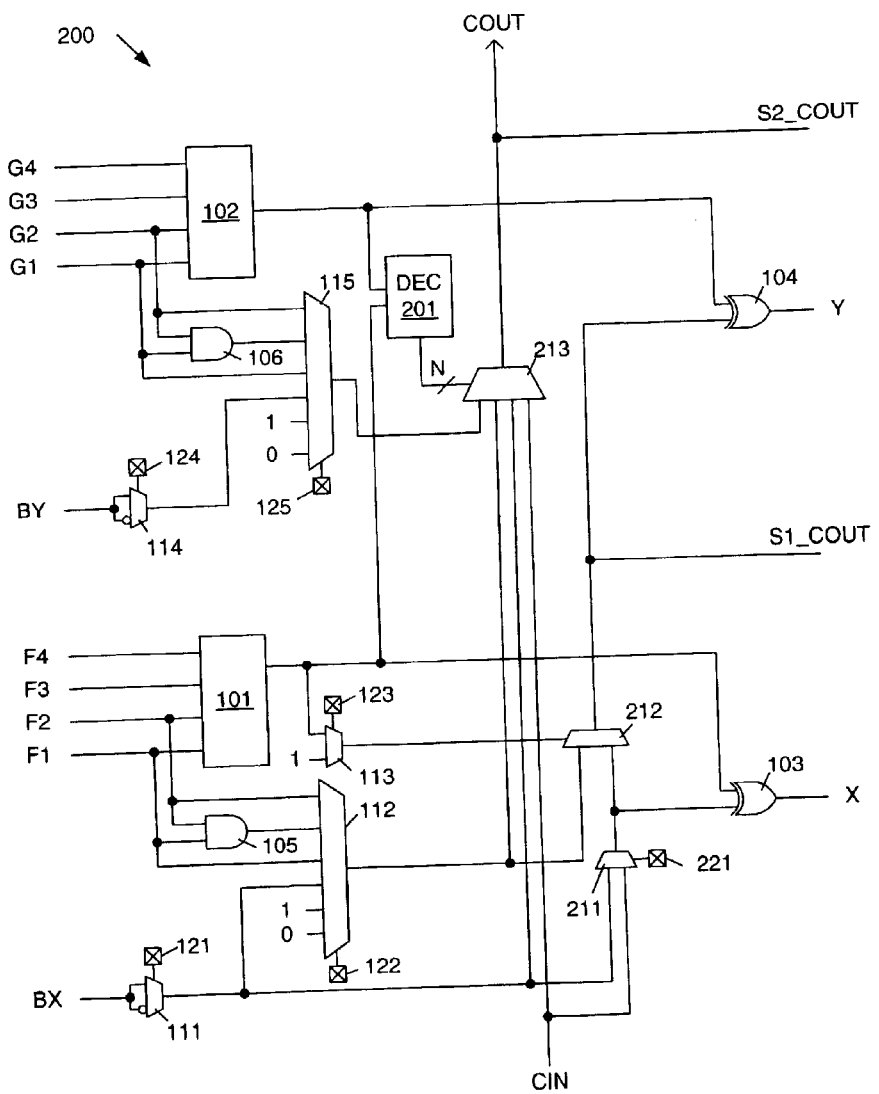
FIG. 2 is a schematic diagram of a configurable logic block (CLB) slice in accordance with one embodiment of the present invention.

FIG. 2 is a schematic diagram of a configurable logic block (CLB) slice 200 in accordance with one embodiment of the present invention. Because portions of CLB slice 200 are identical to portions of CLB slice 100 (FIG. 1), similar elements in FIGS. 1 and 2 are labeled with similar reference numbers. Thus, CLB slice 200 includes function generators 101–102, exclusive OR gates 103–104, AND gates 105–106, multiplexers 111–115, and configuration memory cells 121–125. In addition, CLB slice 200 includes decoder circuit 201, multiplexers 211–213, and configuration memory cell 221.

Multiplexer 211 is a 2-to-1 multiplexer configured in a manner similar to multiplexer 117 (FIG. 1). Thus, the input terminals of multiplexer 211 are coupled to receive the carry input signal CIN provided by an adjacent CLB slice (not shown) and the bypass signal BX (or BX#) provided by multiplexer 111. Multiplexer 211 is configured in response to a configuration data value stored in configuration memory cell 221. The output terminal of multiplexer 211 is coupled to an input terminal of exclusive OR gate 103 and to an input terminal of multiplexer 212.

Multiplexer 212 is a 2-to-1 multiplexer having input terminals coupled to the output terminals of multiplexers 112 and 211. Multiplexer 212 is configured in response to the value provided by multiplexer 113. The output terminal of multiplexer 211, which provides the first stage carry output signal (S1_COUT) is coupled to an input terminal of exclusive OR gate 104.

Multiplexer 213 is a 4-to-1 multiplexer having input terminals coupled to the output terminal of multiplexer 115, the output terminal of multiplexer 112, the output terminal of multiplexer 111, and the carry input terminal CIN. (Note that in the present disclosure, a terminal may be identified by the signal present on the terminal.) The output terminal of multiplexer 213 provides the carry output signal COUT to an adjacent CLB slice (not shown). The output terminal of multiplexer 213 also provides the second stage carry output signal, S2_COUT.

Multiplexer 213 is configured in response to N configuration signals provided by decoder circuit 201, where N is an integer greater than or equal to two. In one embodiment, decoder circuit 201 provides four configuration signals to multiplexer 213 in response to the output signals provided by function generators 101 and 102 (and in response to configuration data values stored in decoder circuit 201, as described in more detail below). In another embodiment, decoder circuit 201 can be configured to provide two configuration signals to control the configuration of multiplexer 213.

Decoder circuit 201 and multiplexer 213 perform the task of carry look-ahead, wherein the carry input signal CIN may be propagated through multiplexer 213 as the carry output signal COUT. Because there is only one path for the carry input signal CIN to propagate as the carry output signal COUT, the speed of the carry-propagation of CLB slice 200 is consistent and easy to model. Moreover, because the first stage carry output signal S1_COUT is generated in parallel with the carry output signal COUT, the speed of the carry function of CLB slice 200 is relatively fast. In a particular embodiment, the delay introduced by multiplexer 213 is on the order of about 100 picoseconds.

Figure 3:
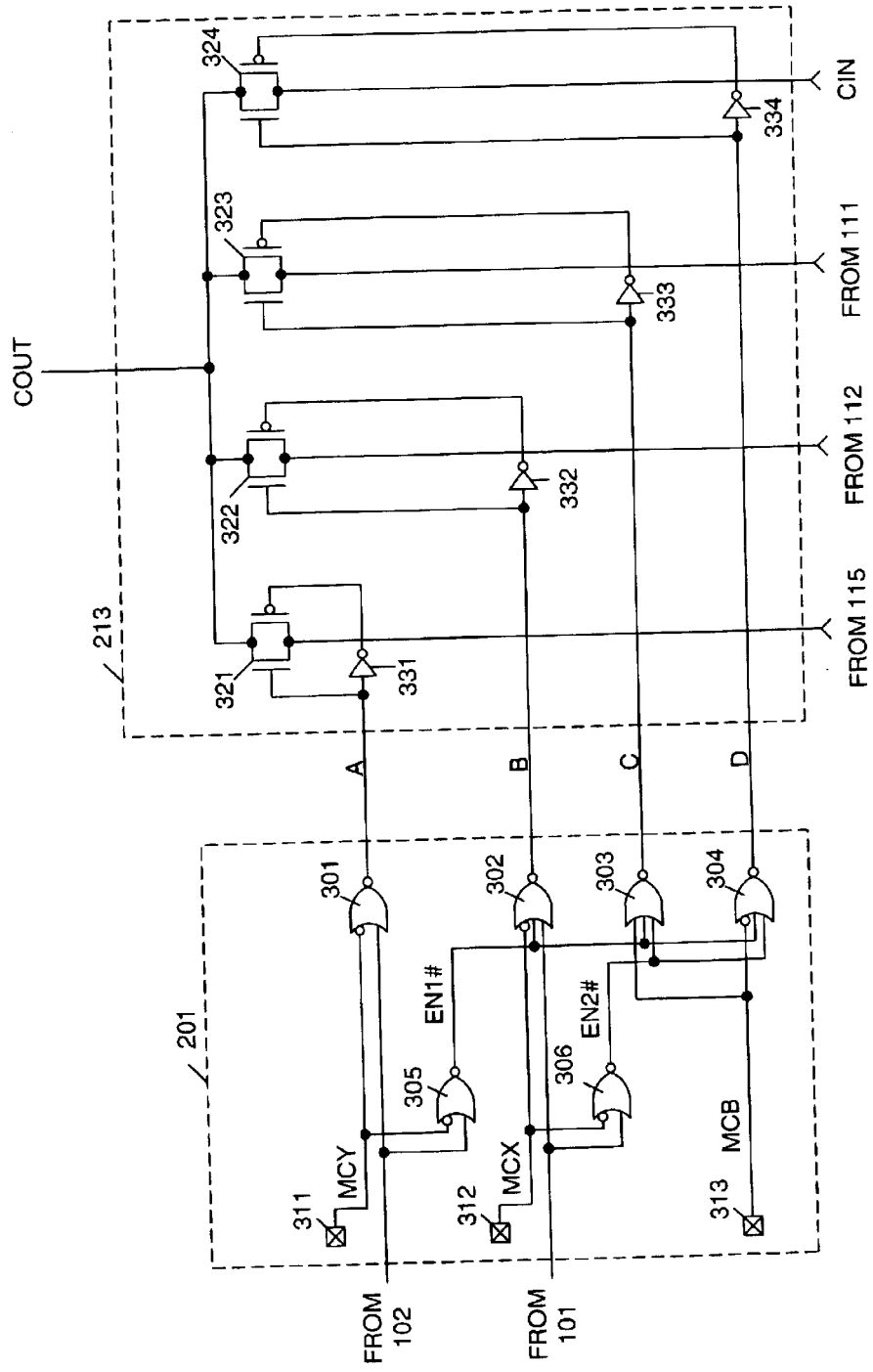
FIG. 3 is a circuit diagram illustrating a decoder and 4-to-1 multiplexer of the CLB slice of FIG. 2 in more detail, in accordance with one embodiment of the present invention.

FIG. 3 is a circuit diagram illustrating decoder 201 and multiplexer 213 in more detail, in accordance with one embodiment of the present invention. In this embodiment, decoder 201 includes NOR gates 301–306 and configuration memory cells 311–313.

Multiplexer 213 includes transmission gates 321–324 and inverters 331–334. Each of transmission gates 321–324 includes parallel-connected n-channel and p-channel pass transistors. The p-channel pass transistors in transmission gates 321–324 are coupled to inverters 331–334, respectively. Transmission gates 321–324 are connected to receive input signals from multiplexers 115, 112, 111 and the carry input terminal CIN, respectively. Each of transmission gates 321–324 is also coupled to the carry output terminal COUT. Advantageously, any signal passing through multiplexer 213 only has to pass through a single transmission gate, thereby resulting in relatively fast signal propagation. Such a multiplexer is referred to as a single-level multiplexer. In one variation, an output driver (e.g., a series-connected pair of inverters) can be connected along the path of the carry output terminal COUT.

Transmission gates 321, 322, 323 and 324 are controlled in response to routing control signals A, B, C and D, respectively. These routing control signals A, B, C and D are provided by NOR gates 301, 302, 303 and 304, respectively.

NOR gates 301–306 and configuration memory cells 311–313 are configured in the following manner. Configuration memory cells 311, 312 and 313 are programmed to store the configuration data values MCY, MCX and MCB, respectively.

NOR gate 301 is configured to receive the inverse of the MCY configuration data value, and the output signal provided by function generator 102. In response, NOR gate 301 provides the routing control signal A to transmission gate 321.

NOR gate 305 is configured to receive the same signals as NOR gate 301. In response, NOR gate 305 provides a first enable signal EN1# (which is an active-low signal) to NOR gates 302–304.

NOR gate 302 is coupled to receive the inverse of the MCX configuration data value, the first enable signal EN1# and the output signal provided by function generator 101. In response, NOR gate 302 provides the routing control signal B to transmission gate 322.

NOR gate 306 is coupled to receive the inverse of the MCX configuration data value, and the output signal provided by function generator 101. In response, NOR gate 306 provides a second enable signal EN2# (which is an active-low signal) to NOR gates 303 and 304.

NOR gate 303 is coupled to receive the MCB configuration data value, the first enable signal EN1# and the second enable signal EN2#. In response, NOR gate 303 provides the routing control signal C to transmission gate 323.

NOR gate 304 is coupled to receive the inverse of the MCB configuration data value, the first enable signal EN1# and the second enable signal EN2#. In response, NOR gate 304 provides the routing control signal D to transmission gate 324.

The operation of decoder logic 201 and 4-to-I multiplexer 213 will now be described.

To perform the carry function for a middle digit in an arithmetic operation, the carry input signal CIN is routed through 4-to-1 multiplexer 213 by programming configuration memory cells 311 and 312 to store logic low configuration data values MCY and MCX. The logic low configuration data values MCY and MCX cause NOR gates 301, 302, 305 and 306 to provide logic low signals A, B, EN1# and EN2#, respectively, thereby turning off transmission gates 321 and 322 and activating NOR gates 303 and 304. Configuration memory cell 313 is programmed to store a logic high configuration data value MCB. This logic high MCB configuration data value causes NOR gate 303 to provide a low routing control signal C, thereby turning off transmission gate 323. The logic high MCB configuration data value also causes NOR gate 304 to provide a logic high routing control signal D, thereby turning on transmission gate 324, such that this transmission gate 324 passes the carry input signal CIN as the carry output signal COUT. Looking at FIG. 2, the high value in memory cell 221 causes multiplexer 211 to propagate the carry in signal CIN to XOR gate 103 and, depending upon the output signal from function generator 101, multiplexer 212 also propagates this CIN signal to XOR gate 104.

Memory cell 313 in FIG. 3 must have the same state as memory cell 211 in FIG. 2, and may actually be the same memory cell if layout choices dictate. When memory cell 221 of FIG. 2 and memory cell 313 of FIG. 3 provide logic 0 values, a carry chain is initiated. Multiplexer 211 selects input signal BX or BX# and thereby allows XOR gates 103 and 104 to sum the two least significant values in an arithmetic operation, while multiplexer 212 provides the carry signal for the second least significant value. Simultaneously, referring again to FIG. 3, it the carry chain is going to be used, memory cells 311 and 312 store logic 1 values so that NOR gates 305 and 306 invert and propagate the outputs from function generators 101 and 102. To initiate a carry chain, a low value in memory cell 313 disables path D and enables path C to provide the value BX (or BX#) if function generators 101 and 102 both provide logic 1 outputs (so the carry input signal from multiplexer 111 can be propagated).

The signal provided by multiplexer 111 (i.e., BX or BX#) is routed through 4-to-1 multiplexer 213 by programming configuration memory cells 311, 312 and 313 to store logic low configuration data values MCY, MCX and MCB. As described above, the logic low configuration data values MCY and MCX cause NOR gates 301 and 302 to provide logic low routing control signals A and B, thereby turning off transmission gates 321–322. The logic low configuration data value MCB causes NOR gate 304 to provide a low routing control signal D, thereby turning off transmission gate 324. The logic low configuration data value MCB also causes NOR gate 303 to provide a logic high routing control signal C, thereby turning on transmission gate 323, such that this transmission gate passes the signal provided by multiplexer 111 (BX or BX#) as the carry output signal COUT.

For middle values in a carry chain, the high value in memory cell 221 (the same value as that in memory cell 313) causes multiplexer 211 to propagate the carry-in signal CIN to XOR gate 103 and multiplexer 212. For initiating a carry chain, the low value in memory cell 221 causes multiplexer 211 to route the BX signal to XOR gate 103 and multiplexer 212.

The signal provided by multiplexer 112 is routed through 4-to-1 multiplexer 213 by programming configuration memory cell 311 to store a logic low configuration data value MCY, programming configuration memory cell 312 to store a logic high configuration data value MCX, and causing function generator 101 to provide a logic low output signal. As described above, the logic low configuration data value MCY causes NOR gate 301 to provide a logic low routing control signal A, thereby turning off transmission gate 321, and causes NOR gate 305 to activate the EN1# signal (low). The logic high configuration data value MCX and the logic low output signal provided by function generator 101 cause NOR gate 302 to provide a logic high control signal B, thereby turning on transmission gate 322, such that this transmission gate passes the signal provided by multiplexer 112 as the carry output signal COUT. The logic high configuration data value MCX and the logic low output signal provided by function generator 101 also cause NOR gate 306 to deactivate the second enable signal EN2# (high). The logic high enable signal EN2# causes NOR gates 303 and 304 to provide logic low routing control signals C and D, thereby turning off transmission gates 323 and 324.

The signal provided by multiplexer 115 is routed through 4-to-1 multiplexer 213 by programming configuration memory cell 311 to store a logic high configuration data value MCY and causing function generator 102 to provide a logic low output signal. The logic high configuration data value MCY and the logic low output signal provided by function generator 102 cause NOR gate 301 to provide a logic high routing control signal A, thereby turning on transmission gate 321, such that this transmission gate passes the signal from multiplexer 115 as the carry output signal COUT. The logic high configuration data value MCY and the logic low signal provided by function generator 102 also cause NOR gate 305 to deactivate the first enable signal EN1# (high). This logic high enable signal EN1# causes NOR gates 302, 303 and 304 to provide logic low routing control signals B, C and D, respectively, thereby turning off transmission gates 322, 323 and 324.

Advantageously, CLB slice 200 allows a carry chain to be started at every second stage of the carry chain, allows operations such as multiplication to be performed efficiently, and still exhibits a relatively fast carry propagation delay, regardless of the configuration of the carry logic path. In accordance with one embodiment, CLB slice 200 exhibits a carry signal propagation delay of about 110 picoseconds or less. CLB slice 200 further enhances the carry processing speed by generating the first stage carry output signal S1_COUT via multiplexers 211–212, in parallel with the carry logic path.

Figure 4A:
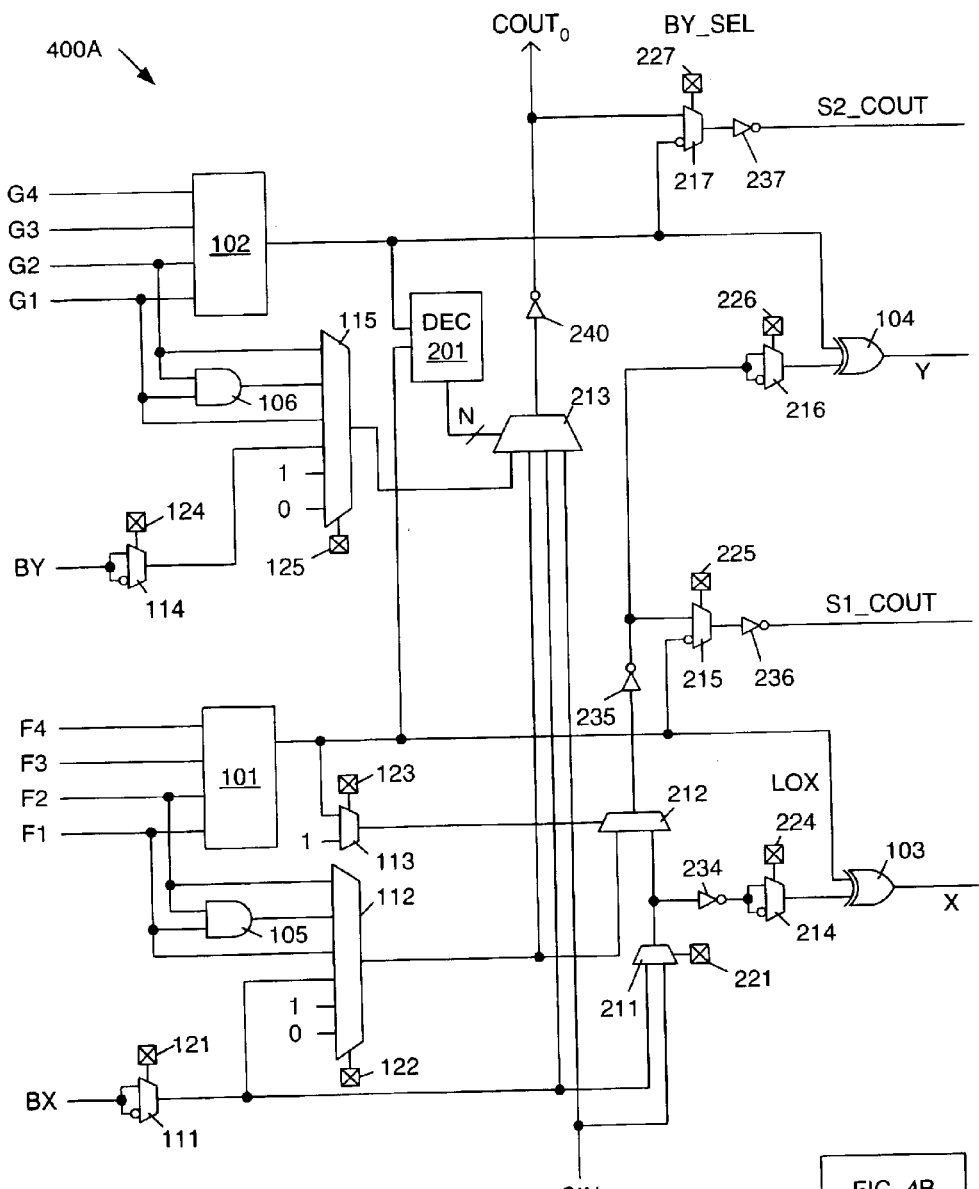
FIG. 4, which consists of FIGS. 4A and 4B as illustrated, shows one variation of the present invention, in which two CLB slices and are combined to form a larger CLB slice.
Figure 4B:
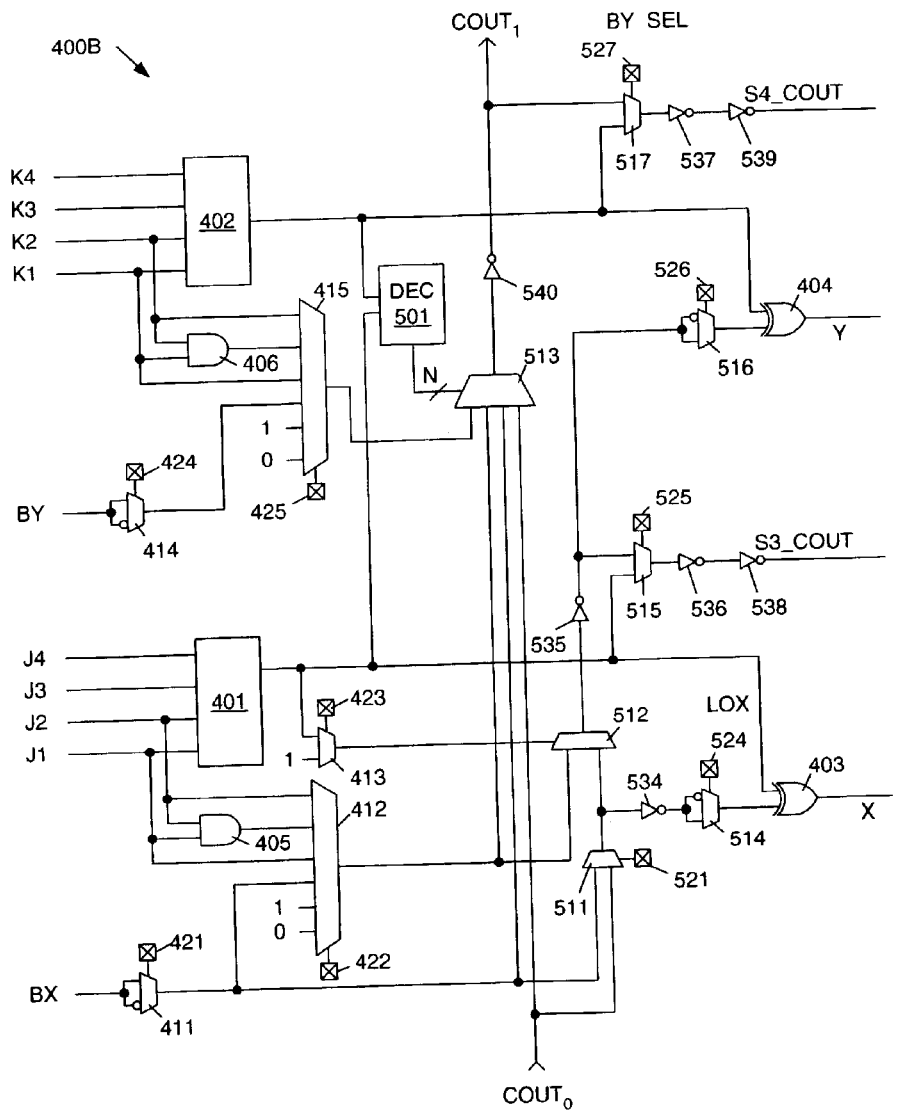

FIG. 4, which consists of FIGS. 4A and 4B as illustrated, shows one variation of the present invention. In this variation, two CLB slices 400A and 400B are combined to form a larger CLB slice. Because CLB slice 400A is similar to CLB slice 200 (FIG. 2), similar elements in FIGS. 2 and 4A are labeled with similar reference numbers. Thus, CLB slice 400A includes function generators 101–102, exclusive OR gates 103–104, AND gates 105–106, multiplexers 111–115 and 211–213, decoder circuit 201, and configuration memory cells 121–125 and 221. In addition, CLB slice 400A includes multiplexers 214–217, configuration memory cells 224–227, and inverters 234–237 and 240.

FIG. 4B is a schematic diagram of CLB slice 400B, which is coupled to CLB slice 400A to form a larger CLB slice. More specifically, the carry output signal $COUT_0$ provided by CLB slice 400A is provided as a carry input signal to CLB slice 400B. CLB slice 400B includes function generators 401–402, exclusive OR gates 403–404, AND gates 405–406, multiplexers 411–415 and 511–517, decoder circuit 501, configuration memory cells 421–425, 521 and 524–527, and inverters 534–540. CLB slice 400B is identical to CLB slice 400A, with the following exceptions. CLB slice 400B includes inverters 539 and 540, which have no equivalent in CLB slice 400A. In addition, the upper input terminals of multiplexers 514 and 516 are inverted in CLB slice 400B, wherein the lower input terminals of corresponding multiplexers 214 and 216 are inverted in CLB slice 400A. Moreover, the lower input terminals of multiplexers 215 and 217 are inverted in CLB slice 400A, wherein the lower input terminals of multiplexers 515 and 517 are not inverted in CLB slice 400B. As described in more detail below, these differences are necessary to provide the proper logic states (polarity) to the various output signals.

Multiplexers 214, 216, 514 and 516 (along with the associated inverters 234, 235, 534 and 535 and associated configuration memory cells 224, 226, 524 and 526) provide flexibility in determining the logic state of the signals provided to exclusive OR gates 103, 104, 403 and 404, respectively.

Multiplexer 215 (along with inverters 235–236 and configuration memory cell 225) enables the carry output signal S1_COUT to be provided by either function generator 101 or multiplexer 212. Similarly, multiplexer 217 (along with inverters 237 and 240 and configuration memory cell 227) enables the carry output signal S2_COUT to be provided by either function-generator 102 or multiplexer 213.

Note that inverter 240 ensures that multiplexer 213 provides adequate drive for the passed carry logic signal, while minimizing the delay along the carry signal path. That is, inverter 240 enables the selected carry signal to be driven out of CLB slice 400A as the carry output signal $COUT_0$. However, inverter 240 causes the carry output signal $COUT_0$ to have the opposite logic state of the carry signal routed by multiplexer 213. Thus, when the carry output signal $COUT_0$ is routed through multiplexer 217, inverter 237 ensures that the resulting carry output signal S2_COUT has the proper logic state. The use of inverter 237 requires that multiplexer 217 have an inverting input terminal coupled to receive the output signal from function generator 102.

Multiplexer 515 (along with inverters 535–536 and 538 and configuration memory cell 525) enables the carry output signal S3_COUT to be provided by either function generator 401 or multiplexer 512. Note that when the carry output signal $COUT_0$ (which, as described above, has an inverted logic state as a result of inverter 240) is routed through inverters 511, 512 and 515 as the carry output signal S3_COUT, inverters 535, 536 and 538 ensure that the inverted logic state of the carry output signal $COUT_0$ is properly modified.

Multiplexer 517 (along with inverters 537, 539 and 540 and configuration memory cell 527) enables the carry output signal S4_COUT to be provided by either function generator 402 or multiplexer 513.

Note that inverter 540 ensures that multiplexer 513 provides adequate drive for the passed carry logic signal, while minimizing the delay along the carry signal path. That is, inverter 540 enables the selected carry signal to be driven out of CLB slice 400B as the carry output signal $COUT_1$. Inverter 540 also causes the carry output signal $COUT_1$ to have the appropriate logic state, because the carry output signal $COUT_0$ had an inverted logic state due to inverter 240. Thus, when the carry output signal $COUT_1$ is routed through multiplexer 517, inverters 537 and 539 ensure that the resulting carry output signal S4_COUT has the proper logic state.

Note that the structure of CLB slices 400A and 400B ensures a minimum delay time along the carry signal path. This delay time is approximately equal to the delay through two transmission gates (one in each of multiplexers 213 and 513) and two inverters (240 and 540). Inverters required to provide the correct polarity of intermediate carry output signals S1_COUT, S2_COUT, S3_COUT and S4_COUT are located outside the carry signal path. Also note that CLB slices 400A and 400B provide a single path for the carry input signal CIN to propagate as the carry output signal $COUT_1$. This provides a consistent (single) carry signal delay along the carry signal path, thereby enabling this path to be easily modeled.

Although the invention has been described in connection with several embodiments, it is understood that this invention is not limited to the embodiments disclosed, but is capable of various modifications, which would be apparent to one of ordinary skill in the art. For example, while the present invention has been described using carry signal paths having two carry output signals, it is understood that the present invention can be expanded for use with carry signal paths having more than two carry output signals. Moreover, while the present carry structure has been described in connection with a field programmable gate array, it is understood that the present carry structure could also be used in a standard cell for an application specific integrated circuit (ASIC). Thus, the invention is limited only by the following claims.

We claim:

1. A configurable logic block (CLB) slice comprising:
a first function generator having a first set of input terminals;
a first multiplexer having a plurality of input terminals coupled to a plurality of the first set of input terminals;
a second function generator having a second set of input terminals;
a second multiplexer having a plurality of input terminals coupled to a plurality of the second set of input terminals;
a carry input terminal for receiving a carry input signal from outside of the CLB slice;
a carry output terminal for providing a carry output signal, which is propagated out of the CLB slice;
a third multiplexer configured to receive more than two input signals, including the carry input signal, a first input signal from the first multiplexer, and a second input signal from the second multiplexer, the third multiplexer having an output terminal coupled to the carry output terminal; and
a decoder circuit configured to receive a plurality of control signals within the CLB slice, and in response, generate a plurality of routing control signals for controlling the configuration of the third multiplexer, wherein the third multiplexer provides the only path between the carry input terminal and the carry output terminal.

2. The CLB slice of claim 1, wherein the third multiplexer is a single-level multiplexer including a plurality of transmission gates, wherein each of the transmission gates is coupled to receive a corresponding one of the input signals, and wherein each of the transmission gates is coupled to the output terminal of the third multiplexer.

3. The CLB slice of claim 2, wherein, at most, one of the transmission gates is turned on in response to the routing control signals.

4. The CLB slice of claim 1, further comprising a driver circuit coupled between the output terminal of the third multiplexer and the carry output terminal.

5. The CLB slice of claim 4, wherein the driver circuit comprises an inverter.

6. The CLB slice of claim 4, wherein the driver circuit comprises a series-connected pair of inverters.

7. The CLB slice of claim 1, further comprising:
a first exclusive OR gate; and
a second multiplexer coupled to receive the carry input signal, wherein the second multiplexer is configurable to route the carry input signal to the first exclusive OR gate.

8. The CLB slice of claim 1, wherein the first and second multiplexers each have one or more input terminals coupled to receive one or more input signals having fixed logic states.

9. The CLB slice of claim 1, further comprising a first logic circuit having a plurality of input terminals coupled to a plurality of the first set of input terminals, and an output terminal coupled to the first multiplexer.

10. The CLB slice of claim 9, further comprising a second logic circuit having a plurality of input terminals coupled to a plurality of the second set of input terminals, and an output terminal coupled to the second multiplexer.

11. The CLB slice of claim 1, wherein the first and second multiplexers are further coupled to receive signals external to the CLB slice.

12. A configurable logic block (CLB) slice comprising:
a carry input terminal for receiving a carry input signal from outside of the CLB slice;
a carry output terminal for providing a carry output signal, which is propagated out of the CLB slice;
a first multiplexer configured to receive more than two input signals, including the carry input signal, the first multiplexer having an output terminal coupled to the carry output terminal;
a decoder circuit configured to receive a plurality of control signal within the CLB slice, and in response, generate a plurality of routing control signals for controlling the configuration of the first multiplexer, wherein the first multiplexer provides the only path between the carry input terminal and the carry output terminal;
a first exclusive OR gate;
a second multiplexer coupled to receive the carry input signal, wherein the second multiplexer is configurable to route the carry input signal to the first exclusive OR gate;
a second exclusive OR gate; and
a third multiplexer coupled to receive the carry input signal from the second multiplexer, wherein the third multiplexer is configurable to route the carry input signal to the second exclusive OR gate.

13. The CLB slice of claim 12, further comprising a fourth multiplexer coupled to receive the carry input signal from the third multiplexer, wherein the fourth multiplexer is configurable to route the carry input signal as an intermediate carry output signal of the CLB slice.

14. A configurable logic block (CLB) slice comprising:
a carry input terminal for receiving a carry input signal from outside of the CLB slice;
a carry output terminal for providing a carry output signal, which is propagated out of the CLB slice;
a first multiplexer configured to receive more than two input signals, including the carry input signal, the first multiplexer having an output terminal coupled to the carry output terminal;
a decoder circuit configured to receive a plurality of control signals within the CLB slice, and in response, generate a plurality of routing control signals for controlling the configuration of the first multiplexer, wherein the first multiplexer provides the only path between the carry input terminal and the carry output terminal;
a first exclusive OR gate;
a second multiplexer coupled to receive the carry input signal, wherein the second multiplexer is configurable to route the carry input signal to the first exclusive OR gate; and
a third multiplexer coupled to receive the carry input signal from the second multiplexer, wherein the third multiplexer is configurable to route the carry input signal from the CLB slice as an intermediate carry output signal.

15. A configurable logic block (CLB) slice comprising:
a carry input terminal for receiving a carry input signal from outside of the CLB slice;
a carry output terminal for providing a carry output signal, which is propagated out of the CLB slice;
a first multiplexer configured to receive more than two input signals, including the carry input signal, the first multiplexer having an output terminal coupled to the carry output terminal;
a decoder circuit configured to receive a plurality of control signals within the CLB slice, and in response, generate a plurality of routing control signals for controlling the configuration of the first multiplexer, wherein the first multiplexer provides the only path between the carry input terminal and the carry output terminal, wherein the decoder circuit comprises one or more configuration memory cells that store configuration data values that control the generation of the routing control signals.

16. A method of routing a carry input signal through a configurable logic block (CLB) slice, the method comprising:
routing the carry input signal through the CLB slice along a first path that controls whether the carry input signal is provided as a carry output signal; and
routing the carry input signal along a second path, parallel to the first path, that is used for generating a sum function; and
routine the carry input signal along a third path, parallel to the second path, as an intermediate carry output signal of the CLB slice.

17. The method of claim 16, wherein the first path comprises a multiplexer and a driver circuit.

18. The method of claim 16, wherein the second path comprises an exclusive OR gate.

19. The method of claim 16, further comprising controlling the first path in response to output signals provided by function generators of the CLB slice.

20. The method of claim 19, further comprising configuring the first path in response to configuration data values stored in configuration memory cells of the CLB slice.

21. A configurable logic block (CLB) structure comprising:
a plurality of function generators;
a carry input terminal for receiving a carry input signal;
a carry initialization input terminal for receiving a carry initialization input signal;
a multiplexer coupled to receive the carry input signal from the carry input terminal, a plurality of output signals from the plurality of function generators, and the carry initialization input signal; and
a carry output terminal for providing a carry output signal from the multiplexer.

22. The CLB structure of claim 21, wherein the multiplexer provides the only path between the carry input terminal and the carry output terminal.

* * * * *